United States Patent
Mori et al.

(10) Patent No.: US 10,505,482 B2
(45) Date of Patent: Dec. 10, 2019

(54) MAGNETIC POLE DIRECTION DETECTION DEVICE

(71) Applicants: Yoji Mori, Aichi (JP); Tomoya Yamanaka, Aichi (JP)

(72) Inventors: Yoji Mori, Aichi (JP); Tomoya Yamanaka, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 16/196,328

(22) Filed: Nov. 20, 2018

(65) Prior Publication Data

US 2019/0158007 A1    May 23, 2019

(30) Foreign Application Priority Data

Nov. 20, 2017  (JP) .................. 2017-222751

(51) Int. Cl.
| | |
|---|---|
| *H02P 21/18* | (2016.01) |
| *H02P 21/22* | (2016.01) |
| *H02P 27/12* | (2006.01) |
| *G01R 33/09* | (2006.01) |
| *H02K 29/06* | (2006.01) |

(Continued)

(52) U.S. Cl.
CPC ............. *H02P 21/18* (2016.02); *G01R 33/09* (2013.01); *H02K 11/215* (2016.01); *H02K 29/06* (2013.01); *H02K 29/08* (2013.01); *H02P 21/22* (2016.02); *H02P 27/12* (2013.01); *B62D 5/0463* (2013.01); *B62D 5/0481* (2013.01); *G01D 5/16* (2013.01)

(58) Field of Classification Search
CPC ......... H02K 29/06; H02P 21/18; H02P 21/22; H02P 27/12; G01R 33/09
See application file for complete search history.

(56) References Cited

U.S. PATENT DOCUMENTS

| | | | | |
|---|---|---|---|---|
| 5,537,019 A | * | 7/1996 | Van Sistine ............. | H02P 6/185 318/400.13 |
| 7,443,130 B2 | * | 10/2008 | Takao ..................... | H02P 21/14 318/720 |

(Continued)

FOREIGN PATENT DOCUMENTS

| | | |
|---|---|---|
| JP | 2004-150931 A | 5/2004 |
| JP | 2016-050841 A | 4/2016 |

*Primary Examiner* — Thai T Dinh
(74) *Attorney, Agent, or Firm* — Osha Liang LLP

(57) ABSTRACT

In a magnetic pole direction detection device, a detecting target magnet is attached to a tip of a rotating shaft of the rotor. A magnetic detection unit outputs a detection signal which changes according to a change in a magnetic field. A magnetic pole direction calculation unit calculates a magnetic pole direction of a rotor based on the detection signal. A current detection unit detects a current flowing through each multiphase coil. A rotating magnetic field vector calculation unit calculates a vector of a rotating magnetic field based on magnitude of the detected current. A direction correction amount calculation unit calculates a direction correction amount based on a direction and magnitude of the rotating magnetic field calculated by the rotating magnetic field vector calculation unit. A magnetic pole direction correction unit corrects the calculated magnetic pole direction by using the calculated direction correction amount calculated.

4 Claims, 7 Drawing Sheets

(51) Int. Cl.
*H02K 29/08* (2006.01)
*H02K 11/215* (2016.01)
*G01D 5/16* (2006.01)
*B62D 5/04* (2006.01)

(56) References Cited

U.S. PATENT DOCUMENTS

| | | | | |
|---|---|---|---|---|
| 7,652,441 B2 * | 1/2010 | Ying Yin Ho | ......... | H02P 1/029 |
| | | | | 318/101 |
| 9,160,264 B2 * | 10/2015 | Hu | ......................... | H02P 6/183 |
| 9,300,234 B2 * | 3/2016 | Kakihara | ................ | H02P 6/183 |

* cited by examiner

MAGNETIC POLE DIRECTION DETECTION DEVICE

CROSS-REFERENCES TO RELATED APPLICATIONS

This application is based upon and claims the benefit of priority from Japanese Patent Application No. 2017-222751, filed on Nov. 20, 2017; the entire contents of which are incorporated herein by reference.

FIELD

One or more embodiments of the present invention relate to a magnetic pole direction detection device, and more particularly to a magnetic pole direction detection device for detecting a magnetic pole direction of a rotor of a multiphase electric motor.

BACKGROUND

In the related art, a technology for detecting a rotation angle of a rotating shaft of a rotor in a multiphase electric motor used for assisting steering of a steering wheel of a vehicle is known. For example, in JP-A-2004-150931, a rotation angle detection device of a motor of which a structure can be simplified without lowering detection accuracy is disclosed. The rotation angle detection device includes a magnet provided at an end portion of the rotating shaft of the motor, a magneto-resistive sensor, and a rotation angle calculation unit, and detects the rotation angle. The rotation angle detection device calculates a rotation speed and rotation acceleration based on the rotation angle, and calculates a speed correction value and an acceleration correction value according to the rotation speed and the rotation acceleration. The detected rotation angle is corrected by the speed correction value and the acceleration correction value, and a corrected rotation angle is calculated.

In JP-A-2016-050841, a magnetic detection device that suppresses manufacturing cost is disclosed. The magnetic detection device is configured to include a magnetic detection unit that detects a change in a magnetic field according to displacement of a detection target and outputs a detection signal having a different phase, a switching unit which is electrically connected to a plurality of magnetic detection units and periodically switches connection with each of the plurality of magnetic detection units, and an operational amplifier for differentially amplifying detection signals which have different phases for each of the plurality of magnetic detection units and are input via the switching unit. In the magnetic detection unit, a permanent magnet is attached to a rotating member such as a steering wheel of a vehicle, and an angle is detected using two sets of magneto-resistive sensors in which four magneto-resistive elements are disposed at 90 degrees.

SUMMARY

However, the inventors have found that there is a limit even if it is attempted to increase the detection accuracy in the multiphase electric motor in a case where the rotation angle of the rotating shaft is detected by utilizing the change in the magnetic field of the permanent magnet provided at the tip of the rotating shaft of the multiphase electric motor by using a magnetic sensor having a magneto-resistive element as in the related art. As a result of intensive investigation for the purpose of improving the detection accuracy, the inventors have found that the detection error occurs as a result of being influenced by a magnetic field generated by the current flowing through the coil wound around a stator of the multiphase electric motor.

Accordingly, one or more embodiments of the present invention are intended to provide a magnetic pole direction detection device which improves detection accuracy in a magnetic pole direction of a rotor by calculating a direction correction amount in the magnetic pole direction of the rotor and correcting the magnetic pole direction of the rotor in order to reduce the influence of the magnetic field generated by the current flowing through a multiphase coil for driving the rotor of the multiphase electric motor.

In order to solve the problems described above, there is provided a magnetic pole direction detection device for detecting a magnetic pole direction of a rotor in a multiphase electric motor including the rotor which is rotated by a rotating magnetic field generated by a current flowing through multiphase coils wound around a winding portion provided on a stator. The magnetic pole direction detection device includes a detecting target magnet attached to a tip of a rotating shaft of the rotor, a magnetic detection unit that outputs a detection signal which changes according to a change in a magnetic field, a magnetic pole direction calculation unit that calculates a magnetic pole direction of the rotor before correction based on the detection signal output by the magnetic detection unit, a current detection unit that detects a current flowing through each of the multiphase coils, a rotating magnetic field vector calculation unit that calculates a vector of the rotating magnetic field based on magnitude of the current of each phase coil detected by the current detection unit, a direction correction amount calculation unit that calculates a direction correction amount based on a direction and magnitude of the rotating magnetic field calculated by the rotating magnetic field vector calculation unit, and a magnetic pole direction correction unit that corrects the magnetic pole direction before correction calculated by the magnetic pole direction calculation unit by using the direction correction amount calculated by the direction correction amount calculation unit.

According to this configuration, it is possible to provide a magnetic pole direction detection device in which detection accuracy of the magnetic pole direction of a rotor is improved by calculating the direction correction amount based on the magnitude and direction of the combined current of the current flowing through respective phase coils in the multiphase coils and correcting the magnetic pole direction of the rotor.

Furthermore, in the magnetic pole direction detection device, the magnetic detection unit includes a first bridge circuit and a second bridge circuit, each of which uses magneto-resistive elements, and the first bridge circuit and the second bridge circuit differ in a detection direction of magnetism by 90 degrees.

According to this configuration, the magnetic detection unit can output a Sin waveform and a Cos waveform which are different in phase by 90 degrees from each other.

Furthermore, in the magnetic pole direction detection device, the rotating magnetic field vector calculation unit uses a phase of the current flowing through at least one phase coil as the direction of the vector of the rotating magnetic field.

According to this configuration, if a phase of a sinusoidal wave applied to any one phase coil is detected, phases of the other phases coils can be known and the current at that phase coil can be known and thus, the phase of the current can be associated with the direction of the rotating magnetic field.

Furthermore, in the magnetic pole direction detection device, the magnetic pole direction correction unit calculates the direction correction amount by multiplying data in which the direction of the rotating magnetic field is associated with the correction amount and a correction gain according to the magnitude of the rotating magnetic field.

According to this configuration, a more accurate magnetic pole direction of the rotor can be detected.

According to one or more embodiments of the present invention, it is possible to provide a magnetic pole direction detection device in which the detection accuracy of the magnetic pole direction of the rotor in the multiphase electric motor is improved.

BRIEF DESCRIPTION OF DRAWINGS

FIGS. 9A to 9C are explanatory views for explaining a mechanism in which a detection angle error due to a coil current is generated, in which FIG. 9A is a graph of a magnetic field of the detecting target magnet, FIG. 9B is a graph of the magnetic field generated by the coil current, and FIG. 9C is a graph of a combined magnetic field;

DETAILED DESCRIPTION

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

First Embodiment

Figure 1:
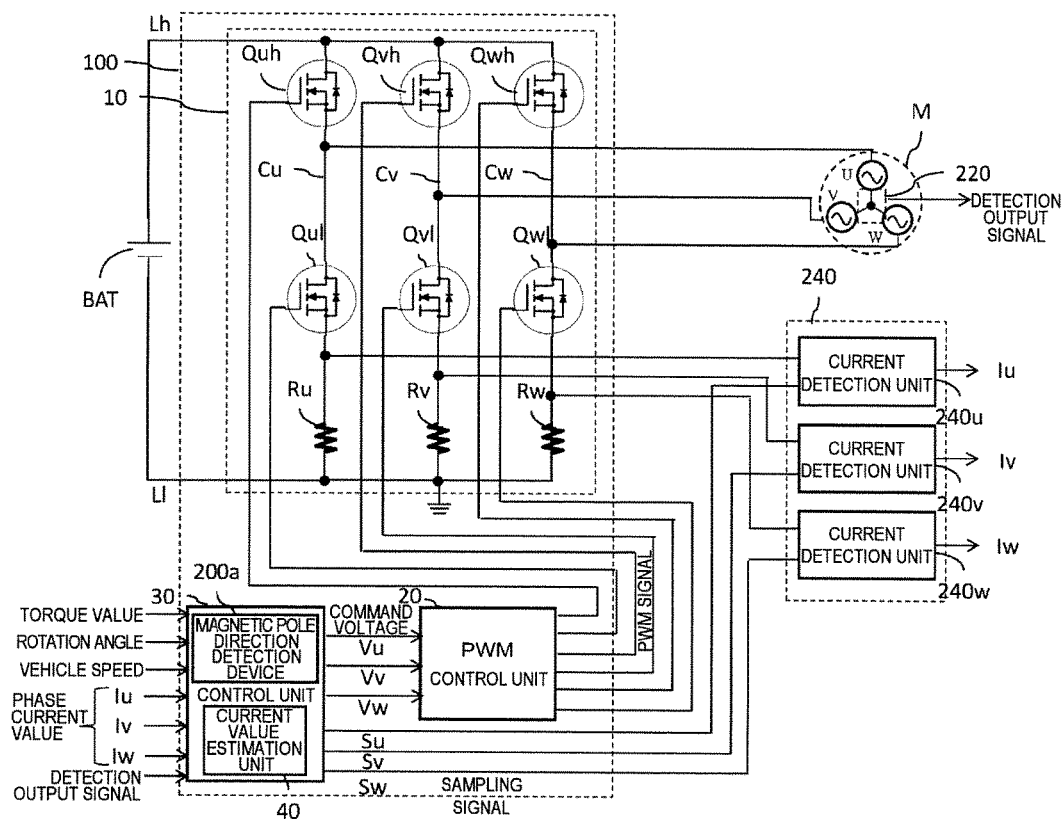
FIG. 1 is a block diagram of a multiphase electric motor control device to which a magnetic pole direction detection device according to a first embodiment of the present invention is applied.

With reference to FIG. 1, a three-phase electric motor M and a multiphase electric motor control device 100 to which a magnetic pole direction detection device 200 according to this embodiment is applied will be described. The multiphase electric motor control device 100 is a three-phase brushless motor used for an electric power steering device (not illustrated) of a vehicle and the like, and drives and controls the three-phase electric motor M that gives an assisting force to a steering operation. The multiphase electric motor control device 100 includes a bridge circuit 10 configured by connecting phase circuits Cu, Cv, and Cw corresponding to phases U, V, and W of the three-phase electric motor M in parallel, a PWM control unit 20 that outputs a pulse width modulation (PWM) signal to each phase of the bridge circuit 10, and a control unit 30 that controls the entire device. The three-phase electric motor M includes a magnetic detection unit 220 and the like and outputs a signal relating to a detected magnetic pole direction. The magnetic detection unit 220 and the like will be described later.

The bridge circuit 10 is connected to a positive electrode side of a battery BAT via a power supply line Lh and is connected (grounded) to a negative electrode side of the battery BAT via a ground line Ll. The phase circuits Cu, Cv, and Cw of the bridge circuit 10 have high potential side switching elements Quh, Qvh, and Qwh provided on the power line Lh side, low potential side switching elements Qul, Qvl, and Qwl provided on the ground line Ll side, and current detectors Ru, Rv, and Rw provided closest to the ground line Ll side in series which are connected in series. In this embodiment, as the high-potential side switching element Quh, Qvh, and Qwh and the low-potential side switching element Qul, Qvl, and Qwl, MOSFETs, that is, metal oxide semiconductor field effect transistors are used.

Each of drains of the high-potential side switching elements Quh, Qvh, and Qwh is connected to the power supply line Lh. Each of sources of the high-potential side switching elements Quh, Qvh, and Qwh is connected to each of drains of the low-potential side switching elements Qul, Qvl, and Qwl. Each of sources of the low-potential side switching elements Qul, Qvl, and Qwl is connected to the ground line Ll via current detectors Ru, Rv, and Rw. Each of the high-potential side switching elements Quh, Qvh, and Qwh and each of the low-potential side switching elements Qul, Qvl, and Qwl receive the PWM signal generated by the PWM control unit 20 at its gate, and a source-drain path is turned on or off.

Each of the current detectors Ru, Rv, and Rw is a resistor (shunt resistor) for current detection and is provided on the lower potential side (ground side) than the low potential side switching elements Qul, Qvl, and Qwl, and detects the current supplied from the bridge circuit 10 to each of the phases U, V, and W of the three-phase electric motor M by a method described later. Normally, the three-phase electric motor M of the electric power steering apparatus is supplied with driving power by energizing a pseudo sinusoidal wave generated by PWM control using an inverter. At that time, since feedback of the current value of each of the phases U, V, and W is required, the current detectors Ru, Rv, and Rw are provided for detecting the current of each phase in each of the phase circuits Cu, Cv, and Cw.

Each of connection points of the high-potential side switching elements Quh, Qvh, and Qwh and the low-potential side switching elements Qul, Qvl, and Qwl is connected to the phases U, V, and W of the three-phase electric motor M. Each of connection points of the low potential side switching elements Qul, Qvl, and Qwl and the current detectors Ru, Rv, and Rw is connected to each of the current detection units 240u, 240v, and 240w that outputs the phase current values Iu, Iv, and Iw. A voltage drop proportional to the current value occurs in the current detectors Ru, Rv, and Rw due to the phase current flowing in the phase circuits Cu, Cv, and Cw. Although the voltage drop value is an analog value, the voltage drop value is converted into the phase current value Iu, Iv, and Iw and output as a digital value.

The control unit 30 receives the phase current values Iu, Iv, and Iw output from each of the current detection units 240u, 240v, and 240w, a steering torque value of a steering wheel obtained from another sensor or electric control unit (ECU) (not illustrated), a rotation angle (electrical angle) of the three-phase electric motor M, and a vehicle speed as inputs. The control unit 30 further receives a signal concerning the magnetic pole direction detected by the magnetic detection unit 220 of the three-phase electric motor M as an input. Based on the steering torque value given to the steering wheel by the driver at the time of the vehicle speed, the rotational angle of the three-phase electric motor M corrected by the magnetic pole direction detection device 200 to be described later, and each of the phase current values Iu, Iv, and Iw detected by each of the current detection units 240u, 240v, and 240w, the control unit 30 calculates each of command voltages Vu, Vv, and Vw for each phase corresponding to the assisting force as the target value to be given to the steering wheel by the three-phase electric motor M, and outputs the command voltages to the PWM control unit 20. The control unit 30 is constituted with a microcomputer including a CPU and a memory.

The PWM control unit 20 generates each of duty instruction values Du, Dv, and Dw based on each of the command voltages Vu, Vv, and Vw of each of the phases output from the control unit 30. The PWM control unit 20 generates PWM signals for rotationally driving the three-phase electric motor M based on the duty instruction values Du, Dv, and Dw, and outputs the PWM signals to the high potential side switching elements Quh, Qvh, and Qwh and the low potential side switching elements Qul, Qvl, and Qwl. The PWM signals are input to gates of the high-potential side switching elements Quh, Qvh, and Qwh and gates of the low-potential side switching elements Qul, Qvl, and Qwl, respectively, and the bridge circuit 10 converts electric power of the battery BAT as a DC power supply by PWM control and supplies the converted electric power to the three-phase electric motor M.

The control unit 30 outputs each of sampling signals Su, Sv, and Sw for instructing the timing at which each of the current detection units 240u, 240v, and 240w measures the current to each of the current detection units 240u, 240v, and 240w. How the current is measured at what timing will be described later. The current detection units 240u, 240v, and 240w measure the currents of respective phases based on the sampling signals Su, Sv, and Sw and feed the phase current values Iu, Iv, and Iw back to the control unit 30.

The control unit 30 includes a part 200a of the magnetic pole direction detection device 200 described later. The part 200a of the magnetic pole direction detection device 200 is a magnetic pole direction calculation unit 230, a rotating magnetic field vector calculation unit 250, a direction correction amount calculation unit 260, and a magnetic pole direction correction unit 270 which will be described later. The control unit 30 receives a signal concerning the magnetic pole direction detected by the magnetic detection unit 220 of the three-phase electric motor M as an input and delivers the signal to the part 200a of the magnetic pole direction detection device 200. In this embodiment, a current value estimation unit 40 and the magnetic pole direction detection device 200 are illustrated as a part of the control unit 30 of the microcomputer, but is not limited thereto. The magnetic pole direction detection device 200 may be provided in a different microcomputer.

Figure 2:
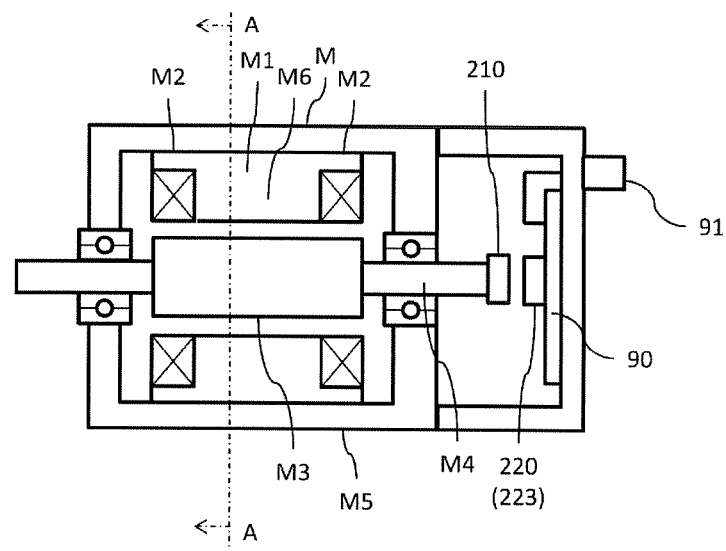
FIG. 2 is a schematic cross-sectional view of a three-phase electric motor to which the magnetic pole direction detection device according to the first embodiment of the present invention is applied, in a cross-section in a rotating shaft direction.

With reference to FIG. 2, the three-phase electric motor M will be described. The three-phase electric motor M includes a rotating shaft M4, a magnetized rotor M3 fixed to the rotating shaft M4, a multiphase coil M2 wound around a teeth M6 (a winding portion) provided in a stator M1 provided at a position facing the rotor M3, a case M5 including the multiphase coil M2 on its inner wall, a detecting target magnet 210 including a pair of magnetic poles attached to the tip of the rotating shaft M4, a magnetic detection unit 220 including a magneto-resistive element 223, a substrate 90 including various circuits, and a connector 91 for connecting a power supply and a torque signal and the like. The multiphase coil M2 includes a U-phase coil M2U corresponding to the U phase, a V-phase coil M2V corresponding to the V phase, and a W-phase coil M2W corresponding to the W phase, and has three phases. In the rotor M3, three pairs of magnetic poles (i.e., six poles) are formed. These constitutional elements may be known as elements. The magnetic detection unit 220 is provided on the substrate 90 at a position corresponding to the detecting target magnet 210 with an appropriate distance therebetween. The substrate 90 includes circuits such as the control unit 30 for controlling the motor M, the current detection unit 240, the PWM control unit 20, and the bridge circuit 10.

Figure 3:
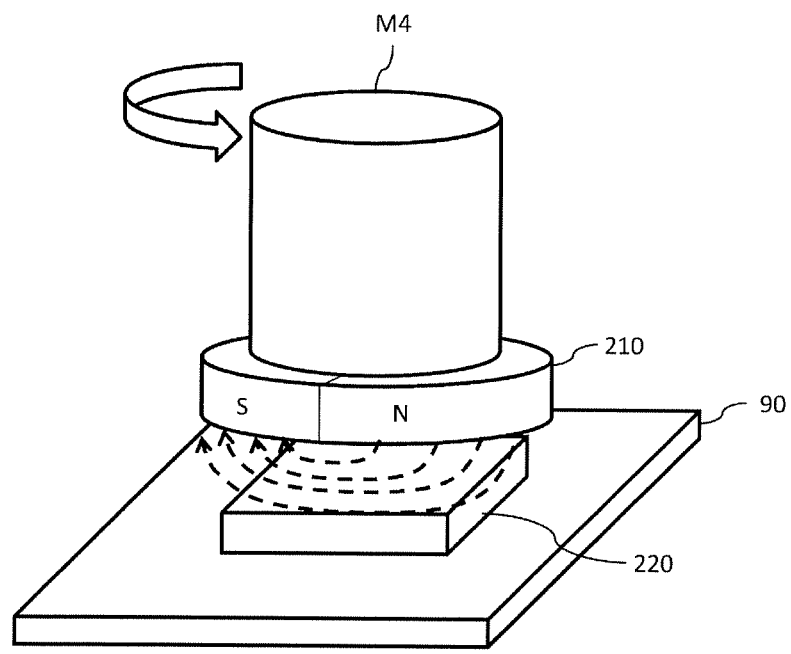
FIG. 3 is an explanatory view for explaining a magnetic detection unit in the magnetic pole direction detection device according to the first embodiment of the present invention.
Figure 4:
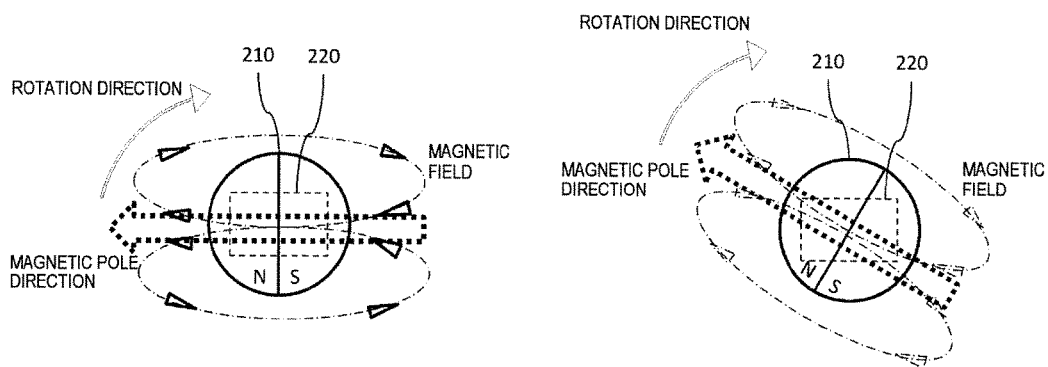
FIG. 4 is an explanatory view for explaining a change in a relationship between a magnetic field generated from a detecting target magnet and the magnetic detection unit in a cross-section perpendicular to the rotating shaft of the three-phase electric motor to which the magnetic pole direction detection device according to the first embodiment of the present invention is applied.

With reference to FIGS. 3 and 4, the magnetic detection unit 220 and the detecting target magnet 210 will be described. The detecting target magnet 210 has a columnar shape and is magnetized such that one of the semicircular columns is N pole and the other is S pole. Accordingly, the detecting target magnet 210 forms a magnetic field (one-dot chain line) in which magnetic field lines emerges from the N pole and enters the S pole, and the magnetic pole direction is the direction from the S pole to the N pole inside the magnet as indicated by the dotted arrow. The magnetic detection unit 220 is provided at a position included in the magnetic field formed by the detection magnet 210 with an appropriate strength.

Since the magnetic detection unit 220 is fixed to the substrate 90 and the detecting target magnet 210 is fixed to the tip of the rotating shaft M4, when the 3-phase electric motor M is operated and the rotating shaft M4 rotates, the magnetic field (dotted line) of the detecting target magnet 210 rotates with respect to the magnetic detection unit 220, which causes a change in the density and direction of the magnetic flux. Then, the magneto-resistive element 223 of the magnetic detection unit 220 detects the change in the magnetic field as the magnetic flux crosses. The magnetic field illustrated in the figure is a schematic representation of a part thereof.

Figure 5:
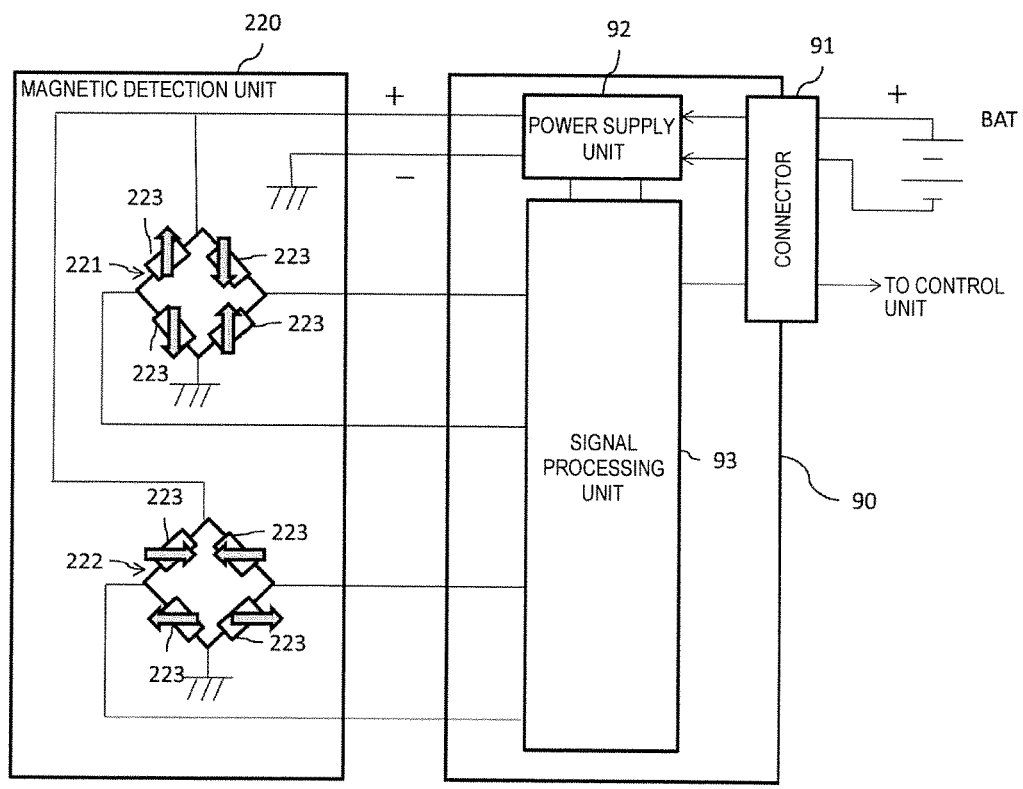
FIG. 5 is a block diagram illustrating the magnetic detection unit and the like in the magnetic pole direction detecting apparatus according to the first embodiment of the present invention.

As illustrated in FIG. 5, the magnetic detection unit 220 includes two magnetic detection units, that is, a first bridge circuit 221 and a second bridge circuit 222 each of which includes four magneto-resistive elements 223. The magneto-resistive element 223 exhibits the same resistance value in a case where a magnetic field is not acting. Since an electric resistance of the magneto-resistive element 223 changes according to a change in the magnetic field, the magneto-resistive element 223 is supplied with electric power from the direct current power supply BAT via the connector 91 and a power supply unit 92. When there is a change in the magnetic field, the magneto-resistive element 223 changes the voltage accordingly and outputs the voltage. In a case where the magneto-resistive element 223 is, for example, an MR sensor, the first bridge circuit 221 and the second bridge circuit 222 are configured in such a way that the magnetization direction of the magnetization fixed layer is opposite to the direction of the magneto-resistive element 223 on the high potential side and the magneto-resistive element 223 on the low potential side and corresponding magneto-resistive elements in the right bridge and the left bridge are in opposite directions. The direction of the arrow in the figure indicates the magnetization direction of the magneto-resistive element 223.

Figure 6:
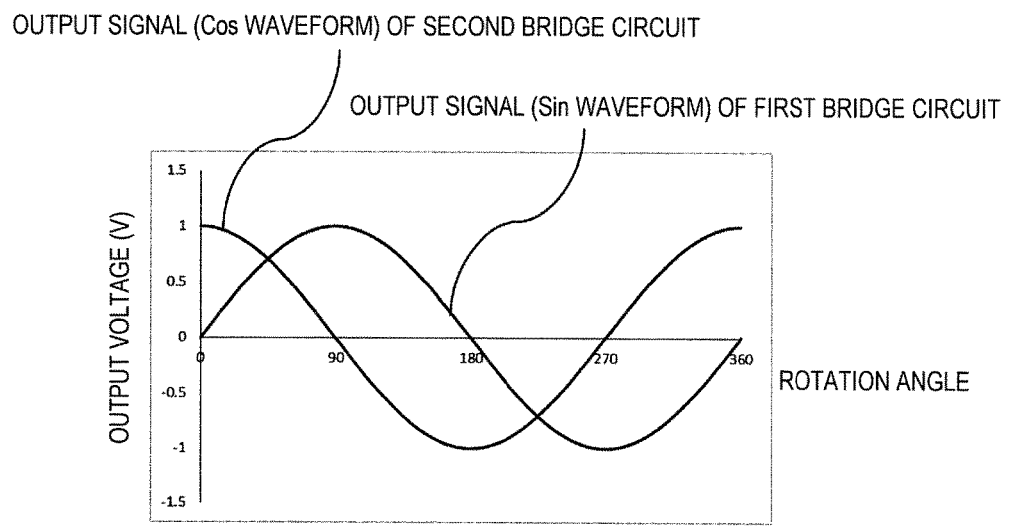
FIG. 6 is an explanatory view illustrating output voltage waveforms of the magnetic detection unit in the magnetic pole direction detection device according to the first embodiment of present the invention.

The magnetization directions of the MR sensors of the first bridge circuit 221 and the second bridge circuit 222 are arranged so as to be deviated by 90 degrees as a whole. That is, detection directions of magnetism of the first bridge circuit 221 and the second bridge circuit 222 are different by 90 degrees. Since the electric resistance of the magneto-resistive element 223 changes according to the magnetic field intensity by rotation of the detecting target magnet 210, a waveform of the voltage output from the first bridge circuit 221 and a waveform of the voltage output from the second bridge circuit 222 are a Sin waveform and a Cos waveform that are 90 degrees out of phase with each other, respectively, as illustrated in FIG. 6. Accordingly, the magnetic detection unit 220 outputs a Sin signal of the Sin waveform output from the first bridge circuit 221 and a Cos signal of the Cos waveform output from the second bridge circuit 222. The waveform of the voltage output from the first bridge circuit 221 and the voltage output from the second bridge circuit 222 are voltages at the midpoint potentials of two magneto-resistive elements 223 in each of the first bridge circuit 221 and second bridge circuit 222. The signal processing unit 93 receives the electric signal relating to the output voltage, processes the electric signal, and outputs a signal detected with respect to the magnetic pole direction to the control unit 30.

Figure 7A:
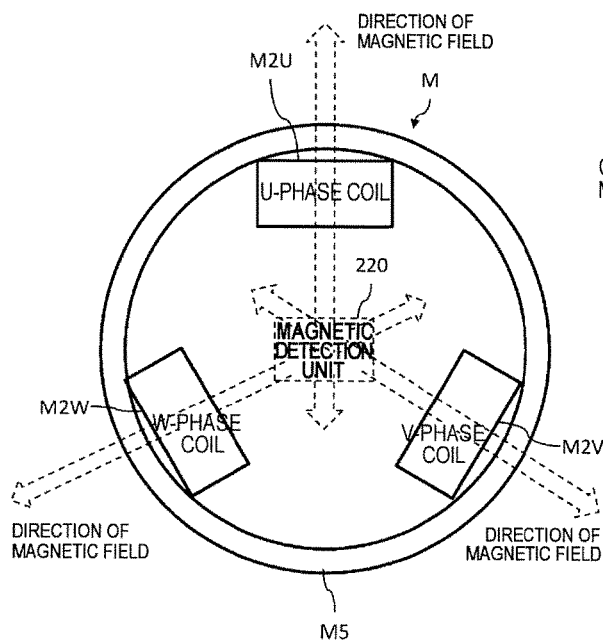
FIG. 7A is an explanatory view illustrating a relationship between a magnetic field generated from the coil and the magnetic detection unit and FIG. 7B is an explanatory view illustrating a combined magnetic field vector of magnetic fields generated from respective coils, in a cross section perpendicular to the rotating shaft of the three-phase electric motor to which the magnetic pole direction detecting device according to the first embodiment of the present invention is applied.
Figure 7B:
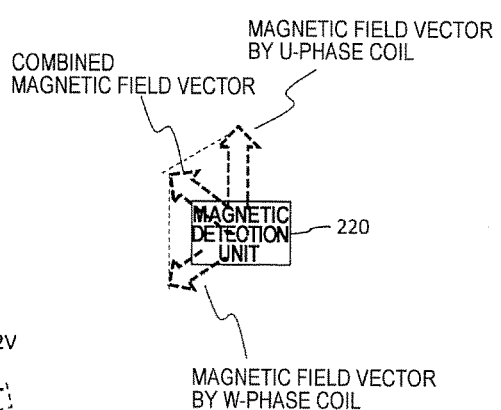

The relationship between the magnetic field generated from each of the multiphase coils M2 and the magnetic detection unit 220 will be described with reference to FIGS. 7A and 7B. The multiphase coils M2 are fixed inside the case M5 so that the directions of the magnetic field (dotted arrows) are different from each other by 120 degrees. The multiphase coil illustrated in FIGS. 7A and 7B is schematically simplified and the coils of respective phases are represented one by one in order to simply describe the correspondence between the current flowing through each of the coils of respective phases (U-phase coil M2U, V-phase coil M2V, and W-phase coil M2W) and the magnetic field, and the multiphase coil does not illustrate the multiphase coil M2 according to this embodiment. The directions of the magnetic fields are perpendicular to coil planes of the respective phase coils M2U, M2V, and M2W, respectively. The respective directions of the magnetic fields intersect at the center of rotation of the three-phase electric motor M. Since the magnetic detection unit 220 is disposed at the center of rotation, although the magnetic detection unit 220 detects magnetic fields with different directions of 120 degrees from each other in FIGS. 7A and 7B, in actuality, the control unit 30 finds out the position and direction of the teeth around which the coil is wound, that is, the direction of the magnetic field generated by each coil.

The intensity of the magnetic field generated by each of the phase coils M2U, M2V, and M2W is proportional to magnitude of the current flowing through each of the phase coils M2U, M2V, and M2W. As described above, the magnitude of this current is determined by a command voltage from the control unit 30. With this configuration, the intensity of the magnetic field generated by each of the phase coils M2U, M2V, and M2W also changes momentarily, but the control unit 30 can also find out the magnitude of the rotating magnetic field by controlling a value of the current flowing through each of the phase coils. With this configuration, the control unit 30 can compute a vector (direction and magnitude) of the rotating magnetic field. The magnetic detection unit 220 outputs a detection signal which changes according to the change in the magnetic field generated as described above. As schematically illustrated in FIG. 7B, the magnetic detection unit 220 detects a change in a magnetic field obtained by combining the magnetic fields generated by the respective phase coils M2U, M2V, and M2W. In FIG. 7B, a state in which no magnetic field is generated in the V-phase coil M2V is illustrated for the sake of simplicity.

Figure 8:
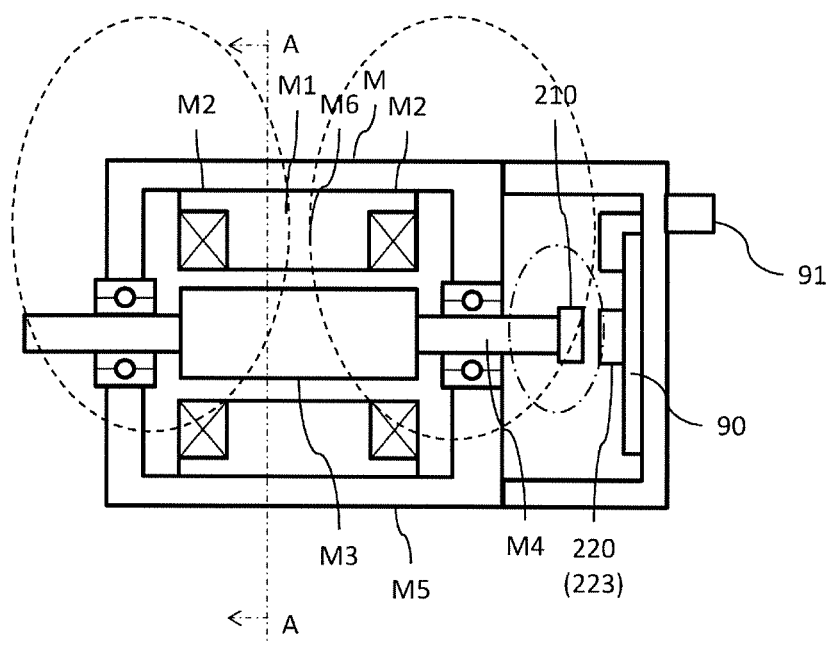
FIG. 8 is an explanatory view illustrating a state in which a magnetic field generated from a coil and a magnetic field generated from a detecting target magnet overlap each other in the cross-section in the rotating shaft direction of the three-phase electric motor to which the magnetic pole direction detecting device according to the first embodiment of the present invention is applied.
Figure 9A:
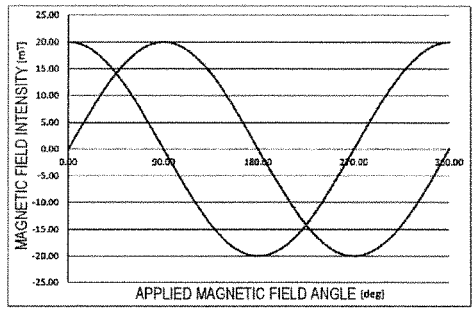
Figure 9B:
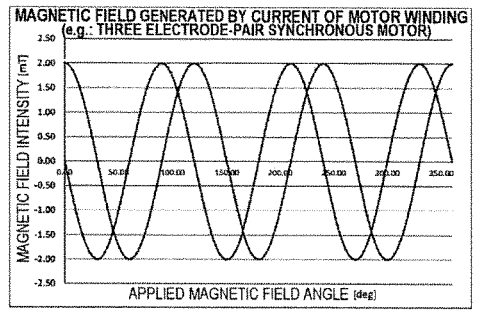
Figure 9C:
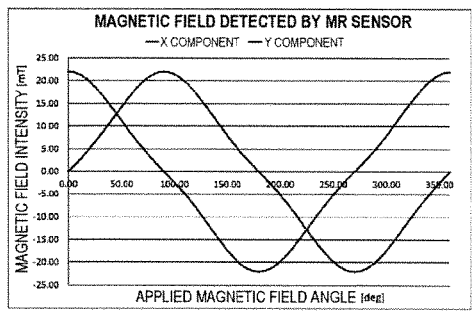

As illustrated in FIG. 8, in the three-phase electric motor M, the magnetic field (one-dot chain line) of the rotating detecting target magnet 210 and the combined magnetic field of the magnetic fields (dotted lines) generated by the rotating respective phase coils overlap each other. With this overlap, as will be described below, in the magnetic detection unit 220, a detection error of the rotation angle of the rotating shaft M4 and the rotor M3 as illustrated in FIGS. 9A to 9C, in other words, a detection error in the magnetic pole direction of the rotor M3 and the detecting target magnet 210 occurs. FIG. 9A illustrates only the change in the magnetic field intensity accompanying rotation of the detecting target magnet 210, which is detected by the magnetic detection unit 220. The vertical axis represents magnetic field intensity (mT) and the horizontal axis represents an applied magnetic field angle (deg). When the change in the magnetic field intensity accompanying the rotation of the detecting target magnet 210 is divided into a component parallel to the magnetic field direction and a component perpendicular to the magnetic field direction having a phase shift of 90 degrees from each other, change in each component of the magnetic field intensity illustrates a substantially sinusoidal wave shape.

FIG. 9B illustrates only the change in the magnetic field intensity caused by the current flowing through the multiphase coil M2 detected by the magnetic detection unit 220. In this embodiment, since the magnetic poles of 3 pole-pairs (6 poles) are formed in the rotor M3 as pairs of N and S poles, in order to cause the rotor to rotate once (360 degrees), the rotating magnetic field rotates three times. Accordingly, the cycle of the magnetic field change by the rotating magnetic field is one-third as compared with the rotation cycle of the rotor M3. On the other hand, since the N and S poles of the detecting target magnet 210 are one pair of poles (two poles), the cycle of the change in the magnetic field intensity due to the rotation of the detecting target magnet 210 is the same as the cycle of the rotor. Although the vertical axis is the magnetic field intensity (mT) and the horizontal axis is the applied magnetic field angle (deg) which is the direction of the rotating magnetic field, since the maximum value in FIG. 9B is 2 mT while the maximum value in FIG. 9A is 20 mT, a scale of the vertical axis is represented by a scale of one-tenth of the magnetic field intensity accompanying the rotation of the detecting target magnet 210. The applied magnetic field angle can be obtained by measuring the current flowing through the respective phase coils by the current detection unit 240, obtaining vectors of the magnetic fields generated in the respective phase coils based on the current value, and combining the vectors. In this embodiment, since the rotating shaft M4 makes one rotation (=360 degrees) as the rotating magnetic field rotates three times, when the rotating magnetic field rotates 360 degrees, a mechanical angle of the rotating shaft M4 is rotated by 120 degrees.

The magnetic field actually detected by the magnetic detection unit 220 is a combined magnetic field of the magnetic fields accompanying the rotation of the detecting target magnet 210 and the magnetic field caused by the current flowing through the multiphase coil M2. FIG. 9C illustrates the magnetic field in which the two magnetic fields are combined. As illustrated in FIG. 9C, the combined magnetic field has a shape distorted from the sinusoidal shape.

Figure 10:
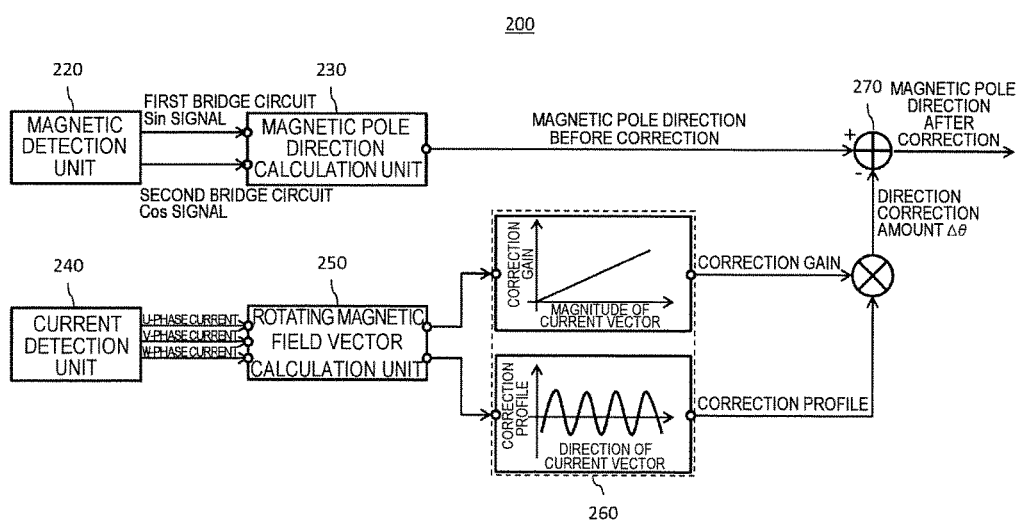
FIG. 10 is a control block diagram of the magnetic pole direction detection device according to the first embodiment of the present invention.

As will be described later, the magnetic pole direction detection device 200 according to the embodiment of the present invention corrects an angle error to accurately detect the magnetic pole direction of the rotor M3 in the multiphase electric motor M. With reference to FIG. 10, the magnetic pole direction detection device 200 will be described. The magnetic pole direction detection device 200 detects the magnetic pole direction of the rotor M3 in the multiphase electric motor M. As described above, the magnetic pole direction detection device 200 includes the rotating detecting target magnet 210, the magnetic detection unit 220 that detects the change in a magnetic field generated by the detecting target magnet 210 and outputs a detection signal having a different phase as described above, and the current detection units 240U, 240V, and 240W that respectively detect the currents flowing through each of the multiphase coils M2U, M2V, and M2W.

Furthermore, the magnetic pole direction detection device 200 includes the magnetic pole direction calculation unit 230 that calculates a magnetic pole direction before correction of the rotor M3 based on the detection signal output from the magnetic detection unit 220, the rotating magnetic field vector calculation unit 250 that calculates the direction and magnitude of the rotating magnetic field using the magnitudes of the currents of the respective phases detected by the current detection units 240U, 240V, and 240W, the direction correction amount calculation unit 260 that calculates the direction correction amount based on the magnitude and direction of the rotating magnetic field calculated by the rotating magnetic field vector calculation unit 250, and the magnetic pole direction correction unit 270 that corrects the magnetic pole direction before correction calculated by the magnetic pole direction calculation unit 230 using the direction correction amount calculated by the direction correction amount calculation unit 260, in the control unit 30.

The magnetic pole direction calculation unit 230 is configured to calculate the magnetic pole direction θ by calculating an arctangent function (arctan) from the Sin signal (Sin θ) and the Cos signal (Cos θ) output from the magnetic detection unit 220. Although the magnetic pole direction θ includes an error due to the rotating magnetic field, the magnetic pole direction θ corresponds to the rotation angle θ of the rotor M3 of the three-phase electric motor M.

As described above, the rotating magnetic field vector calculation unit 250 can obtain the rotating magnetic field vector by obtaining the vectors of the magnetic fields generated in respective phase coils based on the phase current values Iu, Iv, and Iw of the phase circuits Cu, Cv, and Cw detected by the current detection units 240U, 240V, and 240W and combining the vectors. Since the value of the current flowing through each coil is proportional to the magnitude of the generated magnetic field, the magnitude of the magnetic field can be calculated by measuring the current value. The direction of the teeth M6 around which the coils of respective phases are wound is known according to the motor used and the direction of the magnetic field generated by the current flowing through the coil of each phase can be regarded as being the same as the direction of the teeth M6.

The direction correction amount calculation unit 260 has a correction gain table corresponding to magnitude of a current vector which will be described later and a correction profile table corresponding to a direction of the current vector. The correction gain table is set so that the correction gain increases as the magnitude of the current vector increases. In the correction profile table, a correction profile of an amount to be corrected is set according to an angle of the direction of the current vector. The direction correction amount calculation unit 260 calculates a direction correction amount Δθ in the magnetic pole direction by multiplying the correction gain for the magnitude of the current vector and the correction profile for the direction of the current vector.

In a case were the correction table is created with "magnetic pole direction before correction−mechanical angle=Δθ", in order to obtain the true value (mechanical angle), the magnetic pole direction correction unit 270 corrects the magnetic pole direction by subtracting the direction correction amount Δθ of the magnetic pole direction calculated by the direction correction amount calculation unit 260 from the magnetic pole direction θ before correction calculated by the magnetic pole direction calculation unit 230. On the contrary, when the correction table is created with "mechanical angle−magnetic pole direction before correction=Δθ", in order to obtain the true value (mechanical angle), the magnetic pole direction correction unit 270 corrects the magnetic pole direction calculated by the magnetic pole direction by adding the direction correction amount Δθ of the magnetic pole direction calculated by the direction correction amount calculation unit 260 to the magnetic pole direction θ before correction calculated by the magnetic pole direction calculation unit 230. As described above, the magnetic pole direction detection device 200 corrects the magnetic pole direction θ detected by the magnetic detection unit 220 by using the direction correction amount Δθ of the magnetic pole direction θ calculated from the current vector obtained from the current detected by the current detection unit 240, thereby capable of acquiring a magnetic pole direction with higher accuracy.

Figure 11:
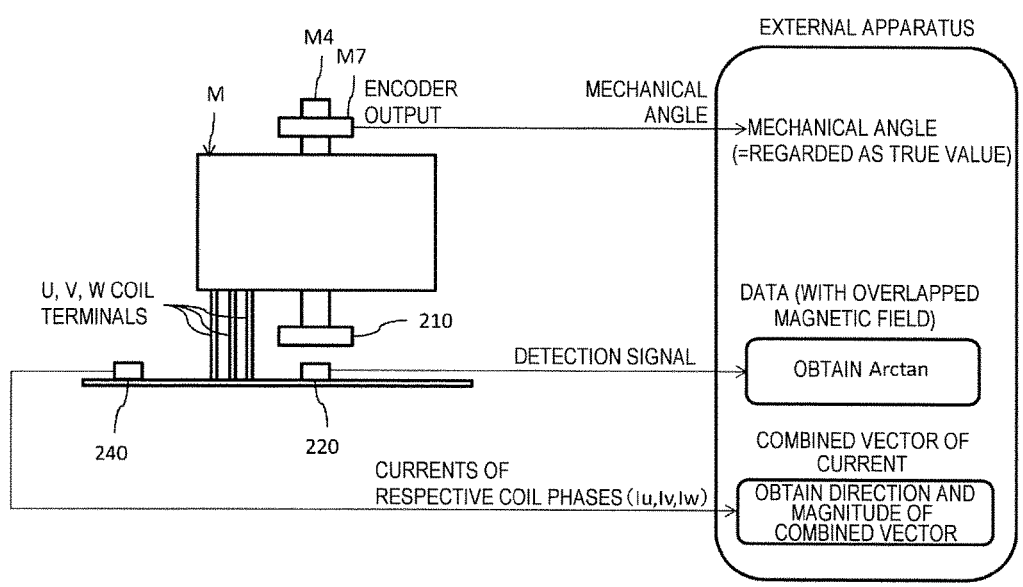
FIG. 11 is an explanatory diagram for explaining a procedure for creating a correction table using an external apparatus in the first embodiment according to the present invention.

With reference to FIG. 11, a procedure for creating a correction table using an external apparatus will be described. By storing the correction table created by the external apparatus in the magnetic pole direction detection device 200, the magnetic pole direction detection device 200 can obtain the direction correction amount Δθ and correct the magnetic pole direction. In the motor M, an encoder M7 which is a sensor for detecting the mechanical angle may be installed on the rotating shaft M4 in order to accurately measure the physical rotation angle (mechanical angle) of the rotor M3 (or the rotating shaft M4). An angle detected by the encoder M7 is set as a true value as a mechanical angle.

When the motor M is driven, the control unit 30 that controls driving of the motor M outputs the current values Iu, Iv, and Iw of the currents that respectively flow through the respective phase coils from the current detection unit 240, and the magnetic detection unit 220 outputs the Sin signal and the Cos signal. In the external apparatus, the mechanical angle from the encoder M7, the current value of each phase coil from the current detection unit 240, and the Sin signal and the Cos signal from the magnetic detection unit 220 are intermittently sampled at times T0, T1, ..., Tn (n is a natural number). The external apparatus computes the arctangent function (arctan) based on the Sin signal and the Cos signal from the magnetic detection unit 220 to thereby calculate the magnetic pole direction θ corresponding to the rotation angle θ of the corresponding rotor M3.

When it is assumed that the magnetic pole direction θ at this stage is referred to as an estimated rotation angle (magnetic pole direction before correction), since the magnetic detection unit 220 detects the overlapped magnetic field at this estimated rotation angle, an error due to the rotating magnetic field is included in the magnetic pole direction. The direction correction amount calculation unit 260 can remove the error by using a correction gain and a correction profile as a correction table created as described below.

The external apparatus associates the mechanical angle, the estimated rotation angle, and the current value of each phase coil sampled at the same time with each other, calculates the difference (angle error) between the mechanical angle and the estimated rotation angle sampled at the same time Tx, and obtains the respective angle errors from time T0 to time Tn. Furthermore, the external apparatus computes a combined vector of the current (indicating the angle and magnitude of the current, this combined vector is referred to as a current vector in this specification) created by the current values of the respective phase coils from time T0 to time Tn.

Since the direction of the teeth M6 around which the respective phase coils are wound is known, the direction of the magnetic field generated by the current flowing through each phase coil is also known. Furthermore, since magnetic permeability of the teeth M6 is also known, if the current value flowing through each phase coil is known, the direction and magnitude of the magnetic field occurring in each phase coil can be computed. Accordingly, the rotating magnetic field vector can be computed by combining the magnetic fields generated by the respective phase coils. If the direction of the current flowing through each phase coil is the direction of the teeth and is represented by a vector using a length proportional to the current, the vector obtained by combining the current vectors of the respective phase coils has a similarity relationship to the rotating magnetic field vector. Since the current vector as described above has a similarity relationship to the rotating magnetic field vector, in the embodiment of the present invention, the vector may be expressed as a current vector instead of the rotating magnetic field vector.

Then, the external apparatus associates the angle of the current vector with the angle error at the same time. For example, when each value at the same time is plotted by setting the angle (direction) of the current vector on the horizontal axis and setting the angle error on the vertical axis, it is possible to create a correction profile in a case where the magnitude of the current vector is a certain value. In another measurement, when a correction profile is created in the same manner by changing the magnitude of the current driving the motor M, it is possible to create a plurality of correction profiles in which the magnitude of the current vector is intentionally changed. The magnetic pole direction detection device 200 selects the correction profile corresponding to the magnitude of the current vector calculated at the timing of computing the angle and selects an angle error at a point on the horizontal axis at which the calculated current vector angle (direction) coincides. The magnetic pole direction detection device 200 corrects the estimated rotation angle using the angle error. As described above, by using the plurality of correction profiles, when the control unit 30 is driving the motor M, the magnetic pole direction detection device 200 can correct the estimated rotation angle computed based on the Sin signal and the Cos signal from the magnetic detection unit 220.

When the magnitude of the current vector is approximately proportional to the angle error, the magnetic pole direction detection device 200 can correct the estimated rotation angle using one correction profile and a correction gain to be described later. The external apparatus creates a correction profile by setting magnitude of a certain current vector as a criterion, and then creates a correction gain table. In the correction gain table, the horizontal axis is the magnitude of the current vector, and the vertical axis is the gain which is the ratio of the magnitude of the current vector and the magnitude of each current vector. For example, the correction gain of the current vector having magnitude 1.2 times the magnitude of the current vector which is set as the criterion is 1.2.

In a case of correcting the angle, the direction correction amount calculation unit 260 selects the correction gain corresponding to the magnitude of the current vector obtained from the current value flowing through the actually measured phase coils driving the motor M at that time from the table of the correction gains. Also, the value of the angle error on the correction profile corresponding to the angle (direction) of the current vector at that time is selected. The selected correction gain is multiplied by the selected angle error to calculate the direction correction amount Δθ which is the magnitude of the angle error to be used for correction. Based on the direction correction amount Δθ, the magnetic pole direction correction unit 270 corrects the magnetic pole direction before correction calculated by the magnetic pole direction calculation unit 230. As described above, by calculating the direction correction amount Δθ based on the magnitude and direction (current vector) of the combined current of the currents flowing through the respective phases in the multiphase coil and correcting the magnetic pole direction θ of the rotor M3, it is possible to provide the magnetic pole direction detection device 200 in which detection accuracy of the magnetic pole direction of the rotor M3 (or the rotating shaft M4) is improved.

As described above, the magnetic pole direction correction unit 270 may calculate the direction correction amount Δθ by multiplying data (angle error) in which the direction of the rotating magnetic field and the correction amount are associated with each other and the correction gain according to the magnitude of the rotating magnetic field. According to this configuration, it is possible to more accurately detect the magnetic pole direction of the rotor M3 (or the rotating shaft M4).

The rotating magnetic field vector calculation unit 250 may use the phase of the current flowing through at least one phase coil as the direction of the rotating magnetic field vector. In the case of a three-phase coil as in this embodiment, the current flowing through each coil changes along a sinusoidal waveform whose phase is shifted by 120 degrees. That is, it can be regarded that the rotating magnetic field changes according to a phase. Then, if the phase of the sinusoidal wave applied to any one phase coil is detected, phases of the other phase coils are also known and the current at the phases is known and thus, a phase of the current can be associated with the direction of the rotating magnetic field.

The present invention is not limited to the illustrated embodiment, and can be implemented with configurations within the scope not deviating from the contents described in the respective claims. While the present invention has been particularly illustrated and described with reference to particular embodiments thereof, it will be apparent to those skilled in the art that various modifications can be made by those skilled in the art to the embodiments described above in terms of quantity and other detailed configurations.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A magnetic pole direction detection device for detecting a magnetic pole direction of a rotor in a multiphase electric motor comprising the rotor which is rotated by a rotating magnetic field generated by a current flowing through multiphase coils wound around a winding portion provided on a stator, the magnetic pole direction detection device comprising:
    a detecting target magnet attached to a tip of a rotating shaft of the rotor;
    a magnetic detection unit that outputs a detection signal which changes according to a change in a magnetic field;
    a magnetic pole direction calculation unit that calculates a magnetic pole direction of the rotor before correction based on the detection signal output by the magnetic detection unit;
    a current detection unit that detects a current flowing through each of the multiphase coils;
    a rotating magnetic field vector calculation unit that calculates a vector of the rotating magnetic field based on magnitude of the current of each phase detected by the current detection unit;
    a direction correction amount calculation unit that calculates a direction correction amount based on a direction and magnitude of the rotating magnetic field calculated by the rotating magnetic field vector calculation unit; and
    a magnetic pole direction correction unit that corrects the magnetic pole direction before correction calculated by the magnetic pole direction calculation unit by using the direction correction amount calculated by the direction correction amount calculation unit.

2. The magnetic pole direction detection device according to claim 1,
    wherein the magnetic detection unit comprises a first bridge circuit and a second bridge circuit, each of which uses magneto-resistive elements, and
    wherein the first bridge circuit and the second bridge circuit differ in a detection direction of magnetism by 90 degrees.

3. The magnetic pole direction detection device according to claim 1,
    wherein the rotating magnetic field vector calculation unit uses the phase of the current flowing through at least one phase coil as a direction of the vector of the rotating magnetic field.

4. The magnetic pole direction detection device according to claim 1,
    wherein the magnetic pole direction correction unit calculates the direction correction amount by multiplying data in which the direction of the rotating magnetic field is associated with the correction amount by a correction gain according to the magnitude of the rotating magnetic field.

* * * * *